US010224908B1

(12) United States Patent
Fender et al.

(10) Patent No.: US 10,224,908 B1
(45) Date of Patent: Mar. 5, 2019

(54) LOW FREQUENCY VARIATION CALIBRATION CIRCUITRY

(75) Inventors: Joshua David Fender, East York (CA); Navid Azizi, Markham (CA); Gordon Raymond Chiu, North York (CA)

(73) Assignee: Altera Corporation, San Jose, CA (US)

( * ) Notice: Subject to any disclaimer, the term of this patent is extended or adjusted under 35 U.S.C. 154(b) by 1463 days.

(21) Appl. No.: 13/329,089

(22) Filed: Dec. 16, 2011

(51) Int. Cl.
*H03K 5/00* (2006.01)
*H03K 5/19* (2006.01)

(52) U.S. Cl.
CPC ......... *H03K 5/00* (2013.01); *H03K 5/00006* (2013.01); *H03K 5/19* (2013.01); *H03K 2005/0011* (2013.01); *H03K 2005/0013* (2013.01); *H03K 2005/00013* (2013.01); *H03K 2005/00117* (2013.01); *H03K 2005/00123* (2013.01); *H03K 2005/00136* (2013.01); *H03K 2005/00143* (2013.01)

(58) Field of Classification Search
CPC ........ G01R 31/31937; G01R 31/31709; G01R 31/002; G01R 35/005; G01R 13/0272; G01R 13/345; H03K 5/00; H03K 5/00006; H03K 5/19; H03K 2005/00013; H03K 2005/0011; H03K 2005/00117; H03K 2005/00123; H03K 2005/0013; H03K 2005/00136; H03K 2005/00143
USPC .......................................................... 702/89
See application file for complete search history.

(56) References Cited

U.S. PATENT DOCUMENTS

| 7,164,289 B1 * | 1/2007 | Choe et al. ..................... 326/40 |
| 7,542,862 B2 * | 6/2009 | Singh et al. .................... 702/89 |
| 8,143,910 B2 * | 3/2012 | Kobatake ................. 324/765.01 |
| 8,350,589 B2 * | 1/2013 | Chlipala et al. ................ 326/16 |
| 2006/0132339 A1 | 6/2006 | Alon et al. |
| 2010/0190509 A1 | 7/2010 | Davis et al. |

OTHER PUBLICATIONS

Manohararajah et al., U.S. Appl. No. 13/149,562, filed May 31, 2011.
Fung et al., U.S. Appl. No. 13/149,583, filed May 31, 2011.
Lewis, U.S. Appl. No. 13/041,309, filed Mar. 4, 2011.

* cited by examiner

*Primary Examiner* — Gregory J Toatley, Jr.
*Assistant Examiner* — Lynda Dinh
(74) *Attorney, Agent, or Firm* — Treyz Law Group, P.C.; Jason Tsai; Vineet Dixit

(57) ABSTRACT

An integrated circuit may include path delay calibration circuitry. The calibration circuitry may be configured to calibrate respective delay paths so that data and control signals travelling through the respective delay paths experience proper propagation delays during normal user operation. The calibration circuitry may include a high frequency error calibration circuit, a monitoring circuit, and a calibration processing circuit. The high frequency error calibration circuit may be used to compute first calibration settings that take into account jitter and process variations. The monitoring circuit may be used to measure a proxy parameter of interest. The processing circuit may be used to compute an offset based at least partly on the measured value of the proxy parameter. The offset may be applied to the first calibration settings to obtain second calibration settings, which can be used to configure the respective delay paths.

8 Claims, 7 Drawing Sheets

| TEMPERATURE (°C) | DELAY OFFSET (ps) |
|---|---|
| 10 | -50 |
| ⋮ | ⋮ |
| 30 | 0 |
| ⋮ | ⋮ |
| 50 | 50 |
| ⋮ | ⋮ |

FIG. 6A

| TEMPERATURE (°C) | VOLTAGE | DELAY OFFSET (ps) |
|---|---|---|
| 10 | 1.2V | -50 |
| 10 | 1.1V | -48 |
| ⋮ | ⋮ | ⋮ |
| 30 | 1.2V | 0 |
| ⋮ | ⋮ | ⋮ |

FIG. 6B

| PRELIMINARY SETTINGS (CALIBRATED PATH DELAY IN PS) | TEMPERATURE (°C) | DELAY OFFSET (ps) |
|---|---|---|
| 1050 | 10 | -100 |
| 1010 | 10 | -60 |
| ⋮ | ⋮ | ⋮ |
| 1050 | 30 | -50 |
| ⋮ | ⋮ | ⋮ |

FIG. 6C

LOW FREQUENCY VARIATION CALIBRATION CIRCUITRY

BACKGROUND

Integrated circuits include circuit components that are interconnected via conductive paths. These paths may be used to route data signals, control signals, and other electrical signals from one circuit component to another. Signals that are conveyed over these conductive paths may experience respective amounts of path delay (i.e., the amount of time it takes for an electrical signal to propagate through a wired path).

The path delay for at least some of the conductive paths on an integrated circuit may be critical. For example, consider a scenario in which a data signal is conveyed over a first path and a data strobe signal that is associated with the data signal is conveyed over a second path. The path delay of the first path and the path delay of the second path should be configured such that the data signal and its associated data strobe signal are properly synchronized with respect to one another (i.e. so that the rising clock edge of the data strobe signal is properly aligned with respect to the rising clock edge of the data signal). Mismatch (or skew) in path delay between the first and second paths may result in degraded timing margins.

In an effort to provide path delays for optimizing performance, calibration techniques that are performed during device startup have been developed. Conventional startup calibration techniques involve adjusting a delay chain in a path under calibration so that the path under calibration provides the desired path delay. Performing calibration operations using this approach may be effective in calibrating static sources of variation such as process variations but may fail to take into account dynamic sources of variation (e.g., operating temperature and power supply voltage levels can drift over time).

To compensate for dynamic sources of variation, runtime tracking circuitry may be used to monitor operating conditions that vary during normal operation of the integrated circuit. Runtime tracking circuitry may help reclaim additional timing margin by tracking low frequency variations (i.e., variations that vary sufficiently slow over time) and by adjusting the delay chains accordingly. Conventional runtime tracking circuitry monitors the actual path delays and may sometimes require interrupting system operation, which may be unacceptable to a user of the integrated circuit.

SUMMARY

Integrated circuits may include calibration circuitry for calibrating the path delay associated with critical data signal paths and control signal paths. An integrated circuit may, for example, include paths linking different logic circuits, paths over which signals can be received from off-chip sources, and other paths for conveying critical data/control signals. These paths may be calibrated and configured using the calibration circuitry to provide the desired amount of path delay.

The calibration circuitry (sometimes referred to as delay path calibration circuitry) may include a calibration circuit operable to calibrate out static sources of variation such as process variation while reducing error caused by high frequency sources of variation such as jitter, a monitoring circuit for monitoring at least one proxy parameter of interest (e.g., for monitoring operating temperature, voltage, transistor aging effects, selected performance indicators on the integrated circuit, and/or other dynamic sources of variation and low frequency errors), and a calibration processing circuit.

Upon device startup, the calibration circuit may be used to obtain preliminary calibration settings. The preliminary calibration settings are not fed to the respective delay paths. The monitoring circuit may then be used to gather measurement data on at least one proxy parameter (e.g., a parameter reflective of the current operating condition of the integrated circuit, a parameter indicative of the performance of the integrated circuit, etc.). The calibration processing circuit may be configured to identify an appropriate amount of offset based on the gathered measurement data using a desired variation model. The variation model may be formulated based on simulated data, measured data, and/or data calculated using equations. The offset may be applied to the preliminary calibration settings to obtain adjusted calibration settings. The adjusted calibration settings may be stored on the integrated circuit. The adjusted calibration settings may then be used to configure the respective delay paths.

In another suitable embodiment of the present invention, the calibration circuitry may include a parameter adjustment circuit for forcing at least one proxy parameter to a new level during calibration procedures. Altering the level of the proxy parameter (e.g., forcing a change in operating temperature, voltage, expediting aging effects, etc.) and recalibrating path delays may help provide the calibration processing circuit with additional calibration information, thereby improving the accuracy of the variation model.

During normal operation, the monitoring circuit may continue tracking the at least one proxy parameter. The calibration processing circuit may periodically update the adjusted calibration settings based on the tracked parameter using the desired variation model. The calibration circuit need not be used for this parameter tracking approach. Because use of the calibration circuit is not required, the operation of the integrated circuit need not be disrupted when performing runtime dynamic error tracking.

Further features of the present invention, its nature and various advantages will be more apparent from the accompanying drawings and the following detailed description.

BRIEF DESCRIPTION OF THE DRAWINGS

FIGS. 6A, 6B, and 6C are tables showing different ways of modeling a delay path under calibration in accordance with an embodiment of the present invention.

DETAILED DESCRIPTION

Embodiments of the present invention relate to integrated circuits with calibration circuitry. The integrated circuits may be digital signal processors, microprocessors, application specific integrated circuits (ASICs), programmable logic device integrated circuits (PLDs), or other types of integrated circuits having strict signal timing requirements.

Figure 1:
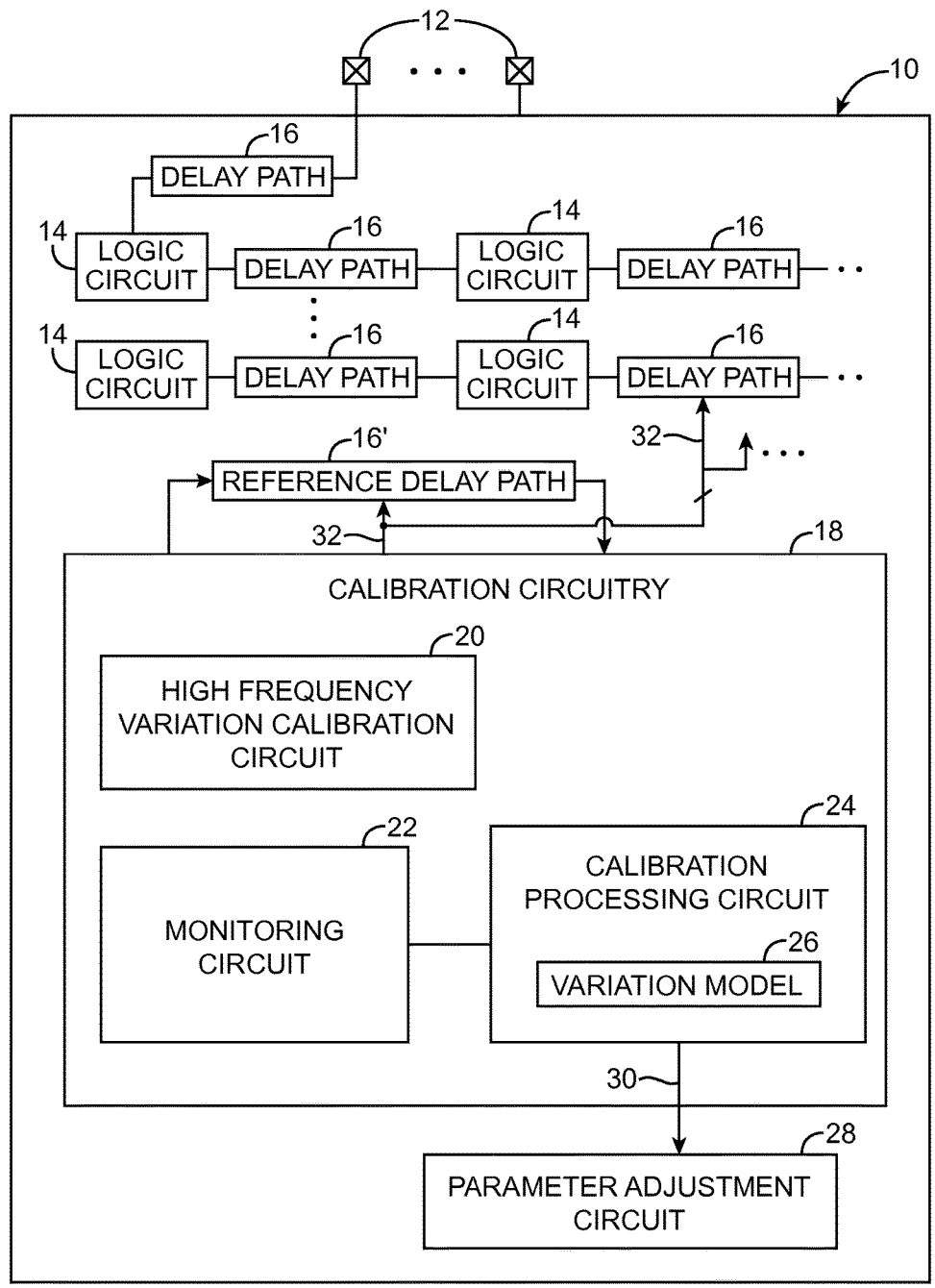
FIG. 1 is a diagram of an illustrative integrated circuit with path delay calibration circuitry in accordance with an embodiment of the present invention.

FIG. 1 is a diagram of an integrated circuit 10 that includes calibration circuitry such as calibration circuitry 18. Integrated circuit 10 may communicate with other devices by sending and receiving signals through input-output (I/O) pins 12. Device 10 may include combinational and sequential logic circuit such as logic circuits 14. Logic circuits 14 may include combinational logic gates, latches, registers, counters, encoders/decoders, (de)multiplexers, look-up tables, arithmetic circuits such as adders and multipliers, etc.

Logic circuits 14 may be interconnected using delay paths 16. As an example, logic circuits 14 may be connected in a chain, where a delay path 16 is interposed between at least one pair of logic circuits in the chain. As another example, some logic circuits 14 may be coupled to input-output pins 12 via delay paths 16. At least some of delay paths 16 may include adjustable delay circuits that are configured to provide desired amounts of delay (e.g., propagation delay experienced by signals travelling through any given delay path).

For example, consider a scenario in which a first logic circuit 14 is configured to receive a data signal and a second logic circuit 14 is configured to receive an associated data strobe signal. The first logic circuit may receive the data signal via a first I/O pin 12 and a first delay path 16, whereas the second logic circuit may receive the associated data strobe signal via a second I/O pin and a second delay path 16. It may be desirable for the data and data strobe signals to arrive synchronously at the first and second logic circuits (e.g., so that the rising clock edges of the data and data strobe signals are aligned).

Calibration circuitry 18 may, as an example, be used to calibrate the first and second delay paths so that the data and data strobes signals arrive synchronously at the first and second logic circuits. This example in which calibration circuitry 18 is used to ensure proper timing relationships between data signals and data strobe signals received from off chip devices is merely illustrative. In general, calibration circuitry 18 may be used to calibrate any delay path 16 on device 10 to ensure that timing requirements are satisfied (e.g., to adjust the amount of delay provided by delay paths 16 so that timing margins are maximized).

As shown in FIG. 1, calibration circuitry 18 may be configured to calibrate a reference delay path 16' instead of individually calibrating each path 16. Reference path 16' may serve as a representative delay path having a delay that is reflective of the performance provided by the current manufacturing technology. If desired, calibration circuitry 18 may be configured to directly calibrate at least some of delay paths 16 that are more timing critical (without using reference delay path 16'). Calibration circuitry 18 may generate control signals over path 32 to adjust the delay of paths 16 and 16' (as an example).

Calibration circuitry (sometimes referred to herein as path delay calibration circuitry) 18 may include a variation calibration circuit such as high frequency variation calibration circuit 20, a monitoring circuit 22, calibration processing circuit 24, and other control circuitry. High frequency variation calibration circuit 20 may use oversampling techniques during startup calibration to reduce errors caused by high frequency sources of variation such as jitter and to compensate for offset caused by static sources of variation such as process variation (e.g., variation arising from non-ideal manufacturing procedures). Variation calibration circuit 20 may first generate preliminary calibration settings. The preliminary calibration settings may not be fed to delay paths 16.

In addition to high frequency variation calibration circuit 20, monitoring circuit 22 and calibration processing circuit 24 may be used to compensate for low frequency variations (e.g., dynamic sources of variations such as variations in power supply voltage, operating temperature, transistor aging effects, etc.). Monitoring circuit 22 may be used to monitor at least one proxy parameter of interest during calibration operations (i.e., a parameter that can potentially affect path delay). For example, monitoring circuit 22 may be configured to monitor the operating temperature of device 10 during calibration. The information gathered using monitoring circuit 22 may be fed to processing circuit 24 for updating the preliminary calibration settings.

The preliminary calibration settings generated using variation calibration circuit 20 may be offset by a predetermined amount based on the value of the proxy parameter being monitored, because the preliminary calibration settings does not take into account dynamic sources of variation. The amount by which the proxy parameter affects the preliminary calibration settings may be characterized using a suitable variation model 26 that is stored in processing circuit 24. Generating model 26 may involve generating a lookup table or an equation based on simulated data, measured data, calculated data, and/or data obtained from characterizing the current manufacturing technology.

Processing circuit 24 may compute an offset based on the level of the measured proxy parameter using variation model 26. The offset may be applied to the preliminary calibration settings to obtain updated (adjusted) calibration settings. The updated calibration settings may be stored (not shown) on device 10 and may be fed to respective delay paths 16 via path 32 so that delay paths 16 are configured to provide desired amounts of path delay.

Processing circuit 24 may also generate control signals to a parameter adjustment circuit 28 via path 30. Parameter adjustment circuit 28 may be considered to be part of calibration circuitry 18. Parameter adjustment circuit 28 may be used to set the proxy parameter being monitored to a predetermined level. For example, circuit 28 may be used to force the operating temperature of device 10 from a current operating temperature of 50° C. to a new operating temperature of 70° C. Forcing the proxy parameter in this way may allow calibration circuitry 18 to obtain additional data points and may help further reduce errors caused by low frequency sources of variations.

Figure 2:
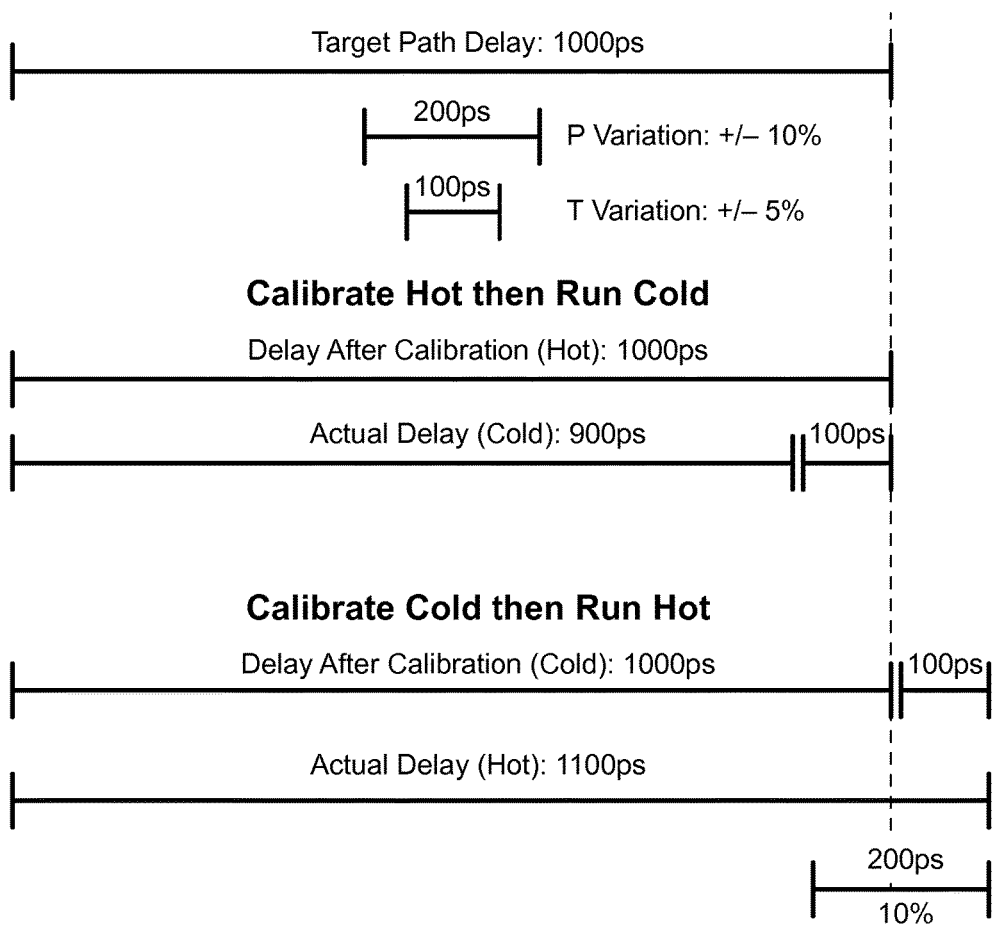
FIG. 2 is diagram showing calibration results obtained using conventional (prior art) path delay calibration techniques.

Conventional calibration techniques fail to take into account dynamic sources of variation such as changes in temperature. FIG. 2 is a diagram showing how calibrating path delay without taking into account dynamic sources of variation can yield inaccurate calibration results. As an example, consider a scenario in which the target path delay for a given path is equal to 1000 ps. As shown in FIG. 2, process variations may cause the actual path delay to vary +/−10% from the target delay of 1000 ps (200 ps total spread), whereas temperature variations may cause the actual path delay to vary +/−5% from the target delay of 1000 ps (100 ps total spread).

Conventional calibration techniques are able to calibrate out the errors introduced as a result of process variations but fail to take into account other factors affecting calibration accuracy. In the example of FIG. 2, if the given path were calibrated while the operating temperature of the integrated circuit was "hot" (e.g., greater than 70° C.), the actual path delay may shorten by up to 100 ps if the integrated circuit subsequently cools down to a "cold" temperature (e.g., less than 30° C.). On the other hand, if the given path were calibrated while the operating temperature was cold, the actual path delay may lengthen by up to 100 ps if the integrated circuit subsequently heats up to a "hot" temperature. As shown in these two scenarios, the actual path delay following calibration may deviate from the target path delay by +/−10% for a total of a 200 ps spread. Conventional calibration techniques may therefore result in doubling errors caused by dynamic sources of variation, thereby substantially degrading timing margins.

Figure 3:
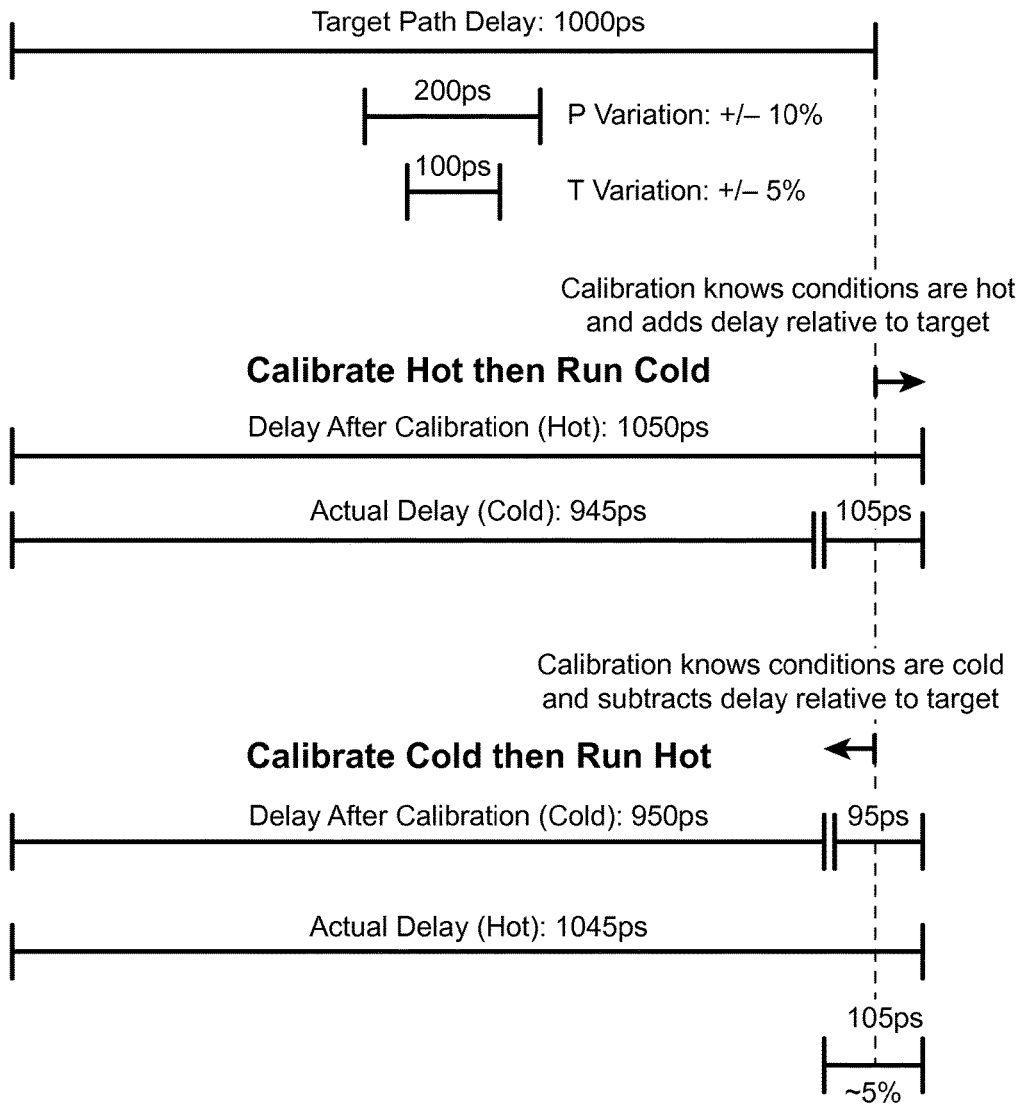
FIG. 3 is a diagram showing illustrative calibration results obtains using path delay calibration techniques in accordance with an embodiment of the present invention.

In one suitable embodiment of the present invention, calibration circuitry 18 takes into account the current operating temperature of device 10 when performing calibration operations. FIG. 3 is a diagram illustrating how calibrating path delay while taking into account low frequency variations can yield improved results in accordance with one embodiment of the present invention. Consider the same scenario in which the target path delay for a given path is equal to 1000 ps, where process variations may cause the actual path delay to vary +/−10% from the target delay and temperature variations may cause the actual path delay to vary +/−5%.

In a first scenario shown in FIG. 3, if the given path was calibrated while the operating temperature of device 10 was hot, calibration circuitry 18 may deliberately introduce additional delay so that the path delay of the given path will be greater than the target path delay (e.g., the path delay of the given path may be equal to 1050 ps immediately after calibration). If device 10 subsequently cools down to a lower temperature, the delay of the given path may shorten by up to 105 ps (10% of 1050), yielding an actual delay of 945 ps.

In a second scenario shown in FIG. 3, if the given path was calibrated while the operating temperature of device 10 was cold, calibration circuitry 18 may deliberately reduce the delay so that the path delay of the given path will be less than the target path delay (e.g., the path delay of the given path may be equal to 950 ps immediately after calibration). If device 10 subsequently heats up to a higher temperature, the delay of the given path may lengthen by up to 95 ps (10% of 950), yielding an actual delay of 1045 ps.

As shown in the first and second scenarios, the actual path delay following calibration may deviate from the target path delay by approximately +/−5% for a total of a 105 ps spread. Calibrate path delay while taking into account the operating temperature may therefore mitigate the doubling effect of dynamic sources of variation described in connection with FIG. 2. This example in which calibration circuitry 18 monitors operating temperature is merely illustrative and does not serve to limit the scope of the present invention. If desired, calibration circuitry 18 may use circuit 22 to monitor other proxy parameters of interest such as operating voltage, device aging effects, performance metrics associated with on-die circuits, information obtained from off-die sources, etc.

Figure 4:
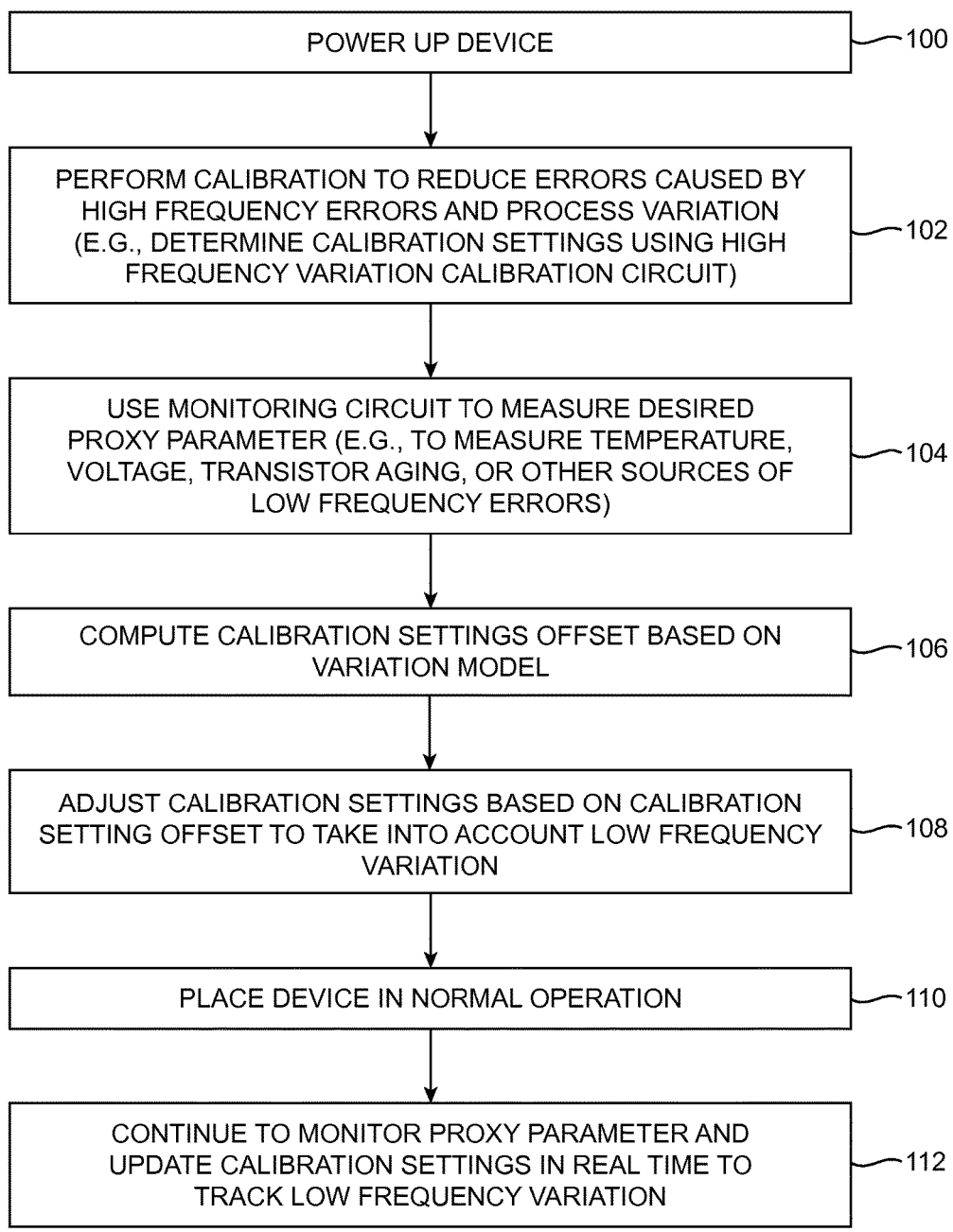
FIG. 4 is a flow chart of illustrative steps for performing path delay calibration using the calibration circuitry of the type shown in FIG. 1 in accordance with an embodiment of the present invention.

FIG. 4 is a flow chart of illustrative steps involved in operating calibration circuitry 18. At step 100, device 10 may be powered up by supplying device 10 with appropriate power supply voltages (e.g., positive and ground power supply voltages). At step 102, variation calibration circuit 20 may be used to reduce errors caused by high frequency noise and static sources of variation. In particular, variation calibration circuit 20 may generate preliminary calibration settings, which if applied to delay paths 16, would compensate for variations resulting from process variations (as an example).

At step 104, monitoring circuit 22 may be configured to measure at least one proxy parameter of interest (e.g., monitoring circuit may be used to measure die temperature, average voltage, transistor aging, and/or other sources of low frequency errors). At step 106, a calibration settings offset may be determined based on variation model 26 using calibration processing circuit 24 (e.g., by referring to a precomputed lookup table, equation, or other characterization information). At step 108, the calibration settings offset may be applied to the preliminary calibration settings to obtain adjusted calibration settings. The adjusted calibration settings may be provided to corresponding delay paths 16 so that delay paths 16 are configured to exhibit desired path delays.

At step 110, device 10 may be placed in normal user operation. At step 112, calibration circuitry 18 may be configured to continuously monitor the at least one proxy parameter and to update the calibrating settings in real time to track any low frequency variation.

Figure 5A:
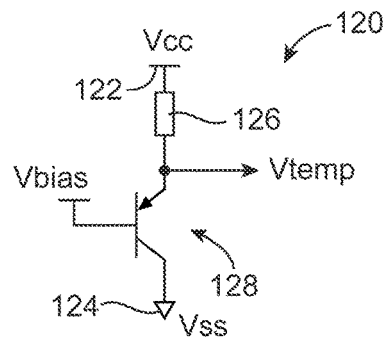
FIGS. 5A, 5B, 5C, and 5D are diagrams of different types of monitoring circuits that can be used to measure a desired proxy parameter in accordance with an embodiment of the present invention.

In one suitable arrangement, monitoring circuit 22 may include temperature sensing circuit 120 that is used for monitoring the operating temperature of device 10 (see, e.g., FIG. 5A). As shown in FIG. 5A, circuit 120 may include a PNP bipolar junction transistor (BJT) 128 and resistive circuit 126 (e.g., a resistor) coupled in series between power supply line 122 (e.g., a power supply line on which positive power supply voltage Vcc is provided) and power supply line 124 (e.g., a ground line on which ground power supply voltage Vss is provided). In particular, BJT 128 may have an emitter terminal that is connected to resistor 126, a collector terminal that is connected to the ground line, and a base terminal that is supplied with bias voltage Vbias. The node at which BJT 128 and resistor 126 are connected may serve as an output for temperature sensor 120 on which a temperature dependent voltage signal Vtemp is provided. Signal Vtemp may be fed to calibration processing circuit 24 as an input to variation model 26 in determining the proper calibration offset to be applied to the preliminary calibration setting.

In another suitable arrangement, monitoring circuit 22 may include an average voltage detection circuit 129 that is used for generating time filtered voltage data for at least one power supply voltage associated with device 10. Voltage detection circuit 129 may, for example, have an input configured to receive Vsense (e.g., a power supply voltage level or other suitable voltage level on device 10) and an output at which digital bits Bsense are provided. The value of Bsense may correspond to a time-filtered voltage level of Vsense.

Figure 5B:
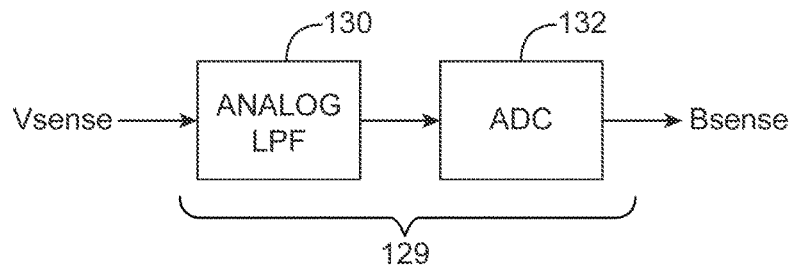

As an example, FIG. 5B shows voltage detection circuit 129 having an analog low pass filter 130 and an analog-to-digital converter (ADC) 132 coupled in series. Filter 130 may have an input operable to receive Vsense and an output. Converter 132 may have an input that is coupled to the output of filter 130 and an output on which Bsense is provided (e.g., the output of ADC 132 may serve as the output of circuit 129).

Figure 5C:
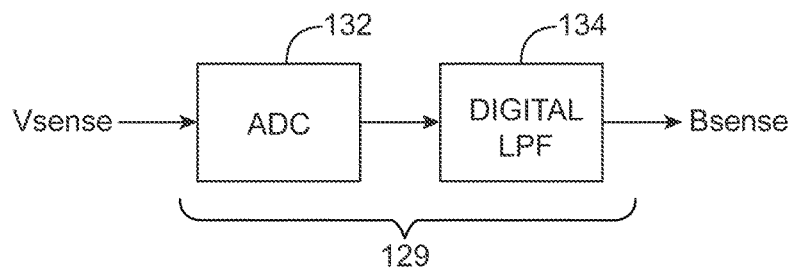

As another example, FIG. 5C shows voltage detection circuit 129 having an ADC 132 and a digital low pass filter 134 coupled in series. The ADC 132 may have an input operable to receive Vsense and an output. Digital filter 134 may have an input that is coupled to the output of ADC 132 and an output on which Bsense is provided (e.g., the output of digital low pass filter 134 may serve as the output of circuit 129). The examples shown in FIGS. 5B and 5C are merely illustrative. If desired, other ways of performing analog/digital filtering of desired voltage signals may be used in conjunction with calibration circuitry 18.

Figure 5D:
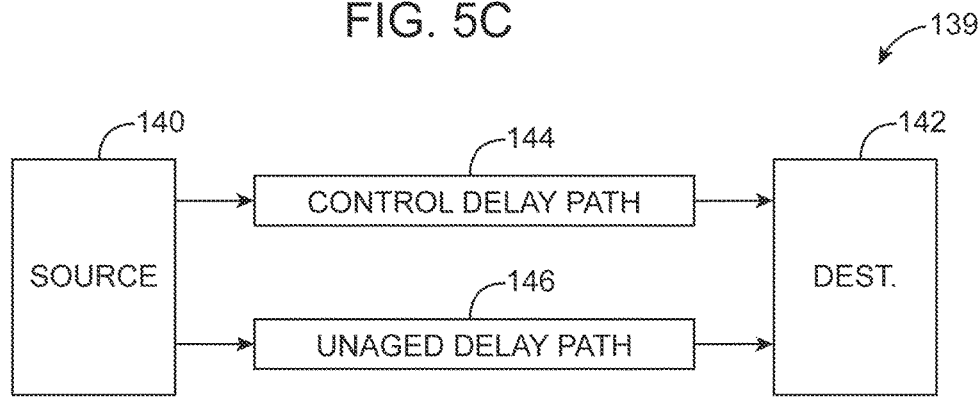

In another suitable arrangement, monitoring circuit 22 may include transistor aging detection circuitry 139 that may be used for measuring transistor aging effects on device 10. FIG. 5D shows an exemplary diagram of circuitry 139. As shown in FIG. 5D, circuitry 139 may include a first (source) circuit 140 and a second (destination) circuit 142. A control delay path 144 and an un-aged delay path 146 may be coupled in parallel between circuits 140 and 142. During normal operation of device 10, delay path 144 may be subject to typical stress levels that are experienced by transistors in delay paths 16, whereas delay path 146 may remain in the unstressed state (e.g., delay path 146 does not receive an actively driven voltage signal from source circuit 140). Delay path 146 may be activated during calibration or periodically during normal operation so that circuitry 139 can measure the difference in the delay of paths 144 and 146. A delay difference that is greater than a predetermined threshold level indicates that device 10 may have suffered from transistor aging, whereas a delay difference that is less than the predetermined threshold level indicates that device 10 has yet to suffer from transistor aging effects and that delay paths are still capable of propagating rising and falling signals with substantially equal transitions times (as an example). If desired, multiple threshold (comparison) levels may be used to determine with finer resolution the degree of transistor aging experienced by delay paths 144 and 146.

The different parameter monitoring techniques described in connection with FIGS. 5A-5D are merely illustrative and do not serve to limit the scope of the present invention. If desired, device 10 may query information from off-die sources (e.g., device 10 may obtain temperature/voltage information from system memory), device 10 may monitor performance parameters associated with on-die circuits (e.g., by monitoring the performance of delay-locked loops, phase-locked loops, dynamic phase alignment circuits, oscillation circuits, and off-chip termination circuits, etc).

FIGS. 6A, 6B, and 6C are tables showing different types of variation models 26 that can be used by calibration processing circuit 24 when identifying a desired calibration settings offset. In one suitable arrangement, the delay offset may be dependent on a selected proxy parameter of interest such as operating temperature (see, e.g., FIG. 6A). In the illustrative table of FIG. 6A, a temperature of 10° C. may correspond to a delay offset of −50 ps (i.e., the path delay during calibration should be 50 ps shorter than the target path delay). A temperature of 30° C. may correspond to zero delay offset. A temperature of 50° C. may correspond to a delay offset of +50 ps (i.e., the path delay during calibration should be 50 ps longer in duration than the target path delay). The values listed in the delay offset column may be based on simulated data, measured data, and calculated data. If desired, the delay offset values may be computed in real time during calibration procedures using equations that are based on the simulated data, measured data, and calculated data. If desired, the delay offset values may be expressed as percentages of the target path delay. For example, temperatures of 10° C., 30° C., and 50° C. may correspond to delay offset amounts of −5%, 0%, and +5% of the target path delay.

In another suitable arrangement, the delay offset may be dependent on multiple selected proxy parameters of interest such as operating temperature and voltage (see, e.g., FIG. 6B). In the illustrative table of FIG. 6B, a temperature of 10° C. and voltage of 1.2 V may correspond to a delay offset of −50 ps, a temperature of 10° C. and voltage of 1.1 V may correspond to a delay offset of −48 ps, . . . , a temperature of 30° C. and voltage of 1.2 V may correspond to a zero delay offset, etc. The values listed in the delay offset column of FIG. 6B may be based on simulated data, measured data, and calculated data. If desired, the delay offset values may be computed in real time during calibration procedures using equations that are based on the simulated data, measured data, and calculated data. If desired, delay offset values may be computed by taking into account at least three proxy parameters of interest, at least four parameters, or any number of performance metrics associated with the operation of device 10.

In another suitable arrangement, the delay offset may be dependent on the preliminary settings and at least one selected proxy parameter of interest such as operating temperature (see, e.g., FIG. 6C). In this example, the preliminary settings may set the actual path delay under current calibration conditions to some particular calibrated path delay. In the illustrative table of FIG. 6C, a calibrated path delay of 1050 ps and a temperature of 10° C. may correspond to a delay offset of −100 ps, a calibrated path delay of 1010 ps and a temperature of 10° C. may correspond to a delay offset of −60 ps, . . . , calibrated path delay of 1050 ps and a temperature of 30° C. may correspond to a delay offset of −50 ps, etc. The values listed in the delay offset column of FIG. 6C may be based on simulated data, measured data, and calculated data. If desired, the delay offset values may be computed in real time during calibration procedures using equations that are based on the simulated data, measured data, and calculated data. As shown in this example, the amount of offset may be based on an initial calibration point measured using variation calibration circuit 20 (e.g., variation model 26 may use the preliminary settings as an input parameter).

The method of calibrating device 10 described thus far depends on the accuracy of variation model 26 and the accuracy of the measure parameters. One way of improving the accuracy of the calibration procedure is to force a parameter change (e.g., to force a parameter change after determining first preliminary calibration settings using variation calibration circuit 20), recalibrating device 10 after the parameter change, and to use the additional data obtained from the recalibration step to develop a more comprehensive variation model.

Figure 7:
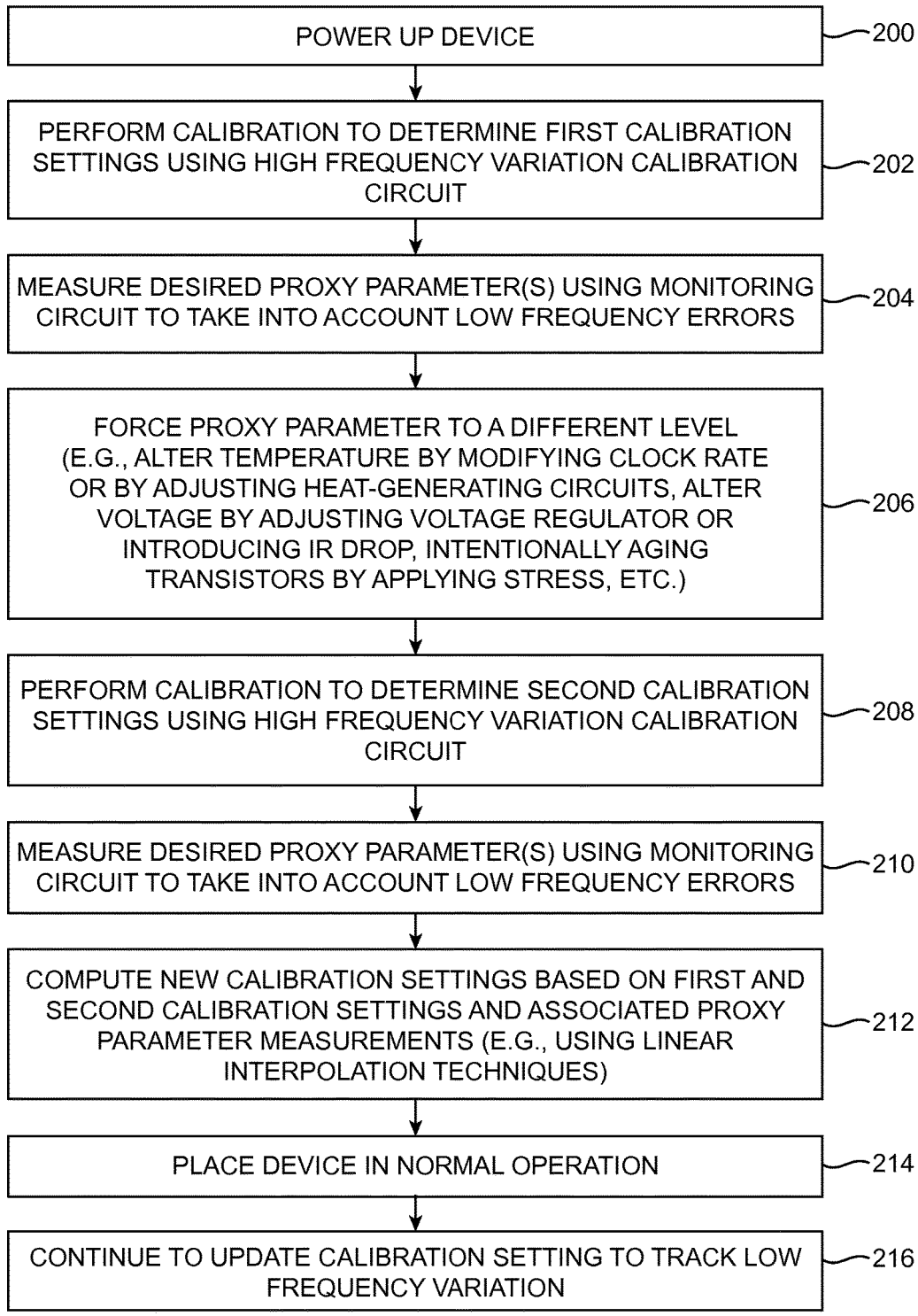
FIG. 7 is a flow chart of illustrative calibration steps for setting a proxy parameter to different levels in accordance with an embodiment of the present invention.

Illustrative steps for setting at least one proxy parameter to a different level during calibration is shown in FIG. 7. At step 200, device 10 may be powered up. At step 202, variation calibration circuit 20 may be used to determine first calibration settings (similar to step 102 of FIG. 4). At step 204, monitoring circuit 22 may be used to measure the desired proxy parameter of interest (e.g., to measure the operating temperature, voltage, transistor aging, or other dynamic sources of variation). The first calibration settings and the value of the proxy parameter measured during step 204 may collectively be fed to processing circuit 24 as a first data point.

At step 206, processing circuit 24 may send control signals to parameter adjustment circuit 28 (see, e.g., FIG. 1)

to force the proxy parameter to a different level. For example, adjustment circuit 28 may alter the operating temperature of device 10 by modifying its internal clock rate or by enabling/disable heat-generating circuits on or in the vicinity of device 10, may alter its average operating temperature by adjusting a corresponding voltage regulator or by introducing IR (voltage) drops at the power supply lines, may intentionally expedite transistor aging by placing selected transistors under elevated stress levels, or by introducing other changes to device 10 that will affect calibration results.

At step 208, variation calibration circuit 20 may be used for a second time to determine second calibration settings. At step 210, monitoring circuit 22 may be used to measure the desired proxy parameter of interest. The second calibration settings and the value of the proxy parameter measured during step 210 may collectively be fed to processing circuit 24 as a second data point. At step 212, processing circuit 24 may be used to compute combined calibration settings based on the first and second data points (e.g., using linear interpolation techniques, using exponential interpolation techniques, using least mean square fitting techniques, etc.). The combined interpolated calibration settings may be computed using a variation model that is based on simulated data, measured data, calculated data, information related to the current process technology, or other performance information related to device 10. The combined calibration settings may be fed to respective delay paths 16 via path 32 so that delay paths 16 are configured to provide desired path delays during operation of device 10.

At step 214, device 10 may be placed in normal operation. At step 216, calibration circuitry 18 may continue to provide updated calibration settings to delay paths by performing low frequency error tracking. For example, monitoring circuit 22 may continue to monitor the desired proxy parameter of interest and may periodically update the calibration settings according to variation model 26 during normal user operation of device 10 (without actually requiring calibration operations using variation circuit 20).

The steps described in connection with FIG. 7 are merely illustrative and do not serve to limit the scope of the present invention. If desired, more than one parameter may be changed and monitored and more than parameter change may be executed to obtain additional data points (e.g., one additional parameter change may be executed by circuit 28 to obtain a total of three data points, two additional parameter changes may be executed by circuit 28 to obtain a total of four data points, etc.).

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   first and second logic circuits;
   a delay path that connects the first and second logic circuits, wherein the delay path provides a first amount of delay to signals travelling through the delay path;
   a monitoring circuit configured to periodically measure a value of at least one parameter associated with dynamic sources of path delay variations within the integrated circuit; and
   a processing circuit configured to access a variation model to identify an offset based on measuring the value of the at least one parameter, wherein the processing circuit is further configured to adjust the delay path to provide a second amount of delay that is different than the first amount of delay based on the offset, and wherein identifying the offset based on the measured parameter comprises taking the measured parameter as an input to an equation and using the equation to compute the offset.

2. The integrated circuit defined in claim 1 further comprising:
   a calibration circuit for obtaining preliminary calibration settings to take into account static sources of path delay variation.

3. The integrated circuit defined in claim 2, wherein the processing circuit is further configured to apply the offset to the preliminary calibration settings to obtain adjusted calibration settings to take into account dynamic sources of variation.

4. The integrated circuit defined in claim 3, wherein the adjusted calibration settings configure delay paths on the integrated circuit.

5. The integrated circuit defined in claim 1, wherein measuring the value of at least one parameter comprises measuring the value of a proxy parameter selected from the group consisting of: an operating temperature, an operating voltage associated with the integrated circuit, an amount of transistor aging associated with delay paths on the integrated circuit, and performance information provided from another integrated circuit.

6. The integrated circuit defined in claim 1, wherein identifying the offset based on the measured parameter comprises referring to a precomputed look-up table having offset values corresponding to different measured parameter levels.

7. A method for calibrating an integrated circuit comprising:
   while a parameter that serves as a dynamic source of path delay variations in the integrated circuit is at a first level, calibrating the integrated circuit to obtain first calibration settings for the integrated circuit using a calibration circuit on the integrated circuit;
   changing the parameter from the first level to a second level that is different than the first level; and
   while the parameter is at the second level, recalibrating the integrated circuit to obtain second calibration settings for the integrated circuit using the calibrating circuit, wherein the first and second calibration settings are stored on the integrated circuit and correspond to respective first and second adjustments to the amount of delay provided by delay paths on the integrated circuit, wherein the first adjustment is different from the second adjustment, wherein the integrated circuit exhibits an operating temperature, and wherein changing the parameter from the first level to the second level comprises changing the operating temperature of the integrated circuit from a first temperature to a second temperature that is different than the first temperature.

8. A method for calibrating an integrated circuit comprising:
   while a parameter that serves as a dynamic source of path delay variations in the integrated circuit is at a first level, calibrating the integrated circuit to obtain first calibration settings for the integrated circuit using a calibration circuit on the integrated circuit;
   changing the parameter from the first level to a second level that is different than the first level; and
   while the parameter is at the second level, recalibrating the integrated circuit to obtain second calibration settings for the integrated circuit using the calibrating circuit, wherein the first and second calibration settings are stored on the integrated circuit and correspond to respective first and second adjustments to the amount of delay provided by delay paths on the integrated circuit, wherein the first adjustment is different from the second adjustment, wherein the integrated circuit exhibits an operating voltage level, and wherein changing the parameter from the first level to the second level comprises changing the operating voltage level of the integrated circuit from a first voltage level to a second voltage level that is different than the first voltage level.

* * * * *